(12) United States Patent  
Blass et al.

(10) Patent No.: US 9,609,752 B1  
(45) Date of Patent: Mar. 28, 2017

(54) INTERCONNECT STRUCTURE CONFIGURED TO CONTROL SOLDER FLOW AND METHOD OF MANUFACTURING OF SAME

(71) Applicant: Lockheed Martin Corporation, Bethesda, MD (US)

(72) Inventors: Daniel L. Blass, Owego, NY (US); Jack V. Ajoian, Philadelphia, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 204 days.

(21) Appl. No.: 14/213,833

(22) Filed: Mar. 14, 2014

Related U.S. Application Data

(60) Provisional application No. 61/789,552, filed on Mar. 15, 2013.

(51) Int. Cl.
  *H05K 1/00* (2006.01)
  *H05K 1/14* (2006.01)

(52) U.S. Cl.
  CPC ................. *H05K 1/141* (2013.01)

(58) Field of Classification Search
  CPC ..... H01L 2224/10; H01L 24/10; H01L 24/11; H01L 24/12; H01L 24/13; H01L 24/14; H01L 24/17; H05K 2201/0236; H05K 2201/0239; H05K 2201/0272; H05K 2201/0323; H05K 2201/0326; H05K 2201/0329; H05K 2201/051; H05K 1/0254; H05K 1/0306; H05K 1/0313; H05K 1/0353; H05K 1/0366; H05K 1/0373; H05K 1/038; H05K 1/0386; H05K 2201/0145; H05K 2201/015; H05K 2201/0154; H05K 2201/0158; H05K 2201/0162; H05K 2201/0166; H05K 2201/017; H05K 2201/0175; H05K 2201/0179;

(Continued)

(56) References Cited

U.S. PATENT DOCUMENTS 5,108,027 A   4/1992   Warner et al.
5,272,111 A   12/1993  Kosaki (Continued)

OTHER PUBLICATIONS

Kondos, Pericles, Borgesen, Peter, Blass, Dan, and Prats, Antonio, "Optimizing Flip Chip Substrate Layout for Assembly", Universal Instruments Corporation, Binghamton, NY.

(Continued)

*Primary Examiner* — Angel R Estrada
*Assistant Examiner* — Pete Lee
(74) *Attorney, Agent, or Firm* — Howard IP Law Group, PC

(57) ABSTRACT

An interconnect structure and method for manufacturing the same includes a substrate and a copper trace line defined on a surface of the substrate. The copper trace line includes a transmission line and a contact pad. The copper trace line is plated with a layer of metal which will oxidize if exposed to the atmosphere. The layer of metal is further plated with a layer of gold. The gold layer is selectively applied to the transmission line and the contact pad to define a gap on the transmission line at the contact pad. The metal layer is exposed in the gap. An oxide layer is formed on the metal layer in the gap. The oxide layer and the substrate surround the contact pad define a barrier to spread of solder.

20 Claims, 6 Drawing Sheets

(58) Field of Classification Search
CPC ... H05K 2201/0183; H05K 2201/0187; H05K 2201/0191; H05K 2201/0195; H05K 1/00; H05K 1/0212; H05K 1/0215; H05K 1/023; H05K 1/0231; H05K 1/0233; H05K 1/0234; H05K 1/0243; H05K 1/0295; H05K 1/141; H05K 1/142; H05K 1/144; H05K 1/145; H05K 1/16; H05K 1/162; H05K 1/165; H05K 1/167; H05K 1/181; H05K 1/01; H05K 1/184; H05K 1/185; H05K 2201/0317; H05K 2201/041; H05K 2201/049; H05K 2201/09763; H05K 2201/09872; H05K 2201/10446; H05K 2201/10454; H05K 2201/10462; H05K 2201/10469; H05K 2201/10477; H05K 2201/10484; H05K 2201/105; H05K 2201/10674; H05K 3/30; H05K 3/32; H05K 3/341; H05K 3/3415; H05K 3/3421; H05K 3/3431; H05K 3/36; H05K 3/46; H05K 1/0286; H05K 1/0287; H05K 1/0289; H05K 1/0292; H05K 1/0293; H05K 1/0296; H05K 23/5226; H05K 1/0221; H05K 1/0222; H05K 1/0225; H05K 1/0251; H05K 1/112; H05K 1/114; H05K 1/115; H05K 1/116; H05K 2201/09063; H05K 2201/09072; H05K 2201/0919; H05K 2201/092; H05K 2201/095; H05K 2201/09509; H05K 2201/09518; H05K 2201/09536; H05K 2201/09545; H05K 2201/09554; H05K 2201/09581; H05K 2201/096; H05K 2201/09609; H05K 2201/09618; H05K 2201/09627; H05K 2201/09636; H05K 2201/09809; H05K 2201/09818; H05K 2201/09827; H05K 2201/00; H05K 2201/09854; H05K 2201/09863; H05K 3/4061; H05K 3/4069; H05K 2201/0305; H05K 2201/09572; H05K 2203/045; H05K 2203/0455; H05K 3/4602; H05K 2201/09718; H05K 3/4046; H05K 2201/037; H05K 2201/0959; H05K 2201/09645

USPC .......... 257/757, 734; 438/613; 174/250–265; 361/761–769

See application file for complete search history.

(56) References Cited

U.S. PATENT DOCUMENTS

| | | | |
|---|---|---|---|
| 5,376,584 | A | 12/1994 | Agarwala |
| 5,480,835 | A | 1/1996 | Carney et al. |
| 6,143,991 | A * | 11/2000 | Moriyama ........ H01L 23/49816 174/260 |
| 6,387,793 | B1 | 5/2002 | Yap et al. |
| 6,790,759 | B1 * | 9/2004 | Wang ...................... H01L 24/03 257/E21.508 |
| 6,974,776 | B2 | 12/2005 | Dean et al. |
| 7,015,132 | B2 | 3/2006 | Lahiri et al. |
| 7,282,433 | B2 | 10/2007 | Tang et al. |
| 7,321,140 | B2 | 1/2008 | Li et al. |
| 7,473,628 | B2 * | 1/2009 | Seto ........................ H01L 24/11 257/E21.508 |
| 7,700,407 | B2 | 4/2010 | Pendse et al. |
| 7,851,345 | B2 | 12/2010 | Shim et al. |
| 8,026,128 | B2 | 9/2011 | Pendse et al. |
| 2005/0194674 | A1 * | 9/2005 | Thomas .............. H01L 25/0657 257/690 |
| 2008/0265408 | A1 * | 10/2008 | Kaufmann .......... H01L 23/3114 257/723 |
| 2009/0200664 | A1 * | 8/2009 | Migita ................. H01L 23/525 257/737 |
| 2010/0089979 | A1 * | 4/2010 | Irslinger ................. B23K 1/19 228/176 |

OTHER PUBLICATIONS

Borgesen, Peter, "Flip Chip on Organic Substrates", Universal Instruments Corporation, Binghamton, NY.

* cited by examiner

INTERCONNECT STRUCTURE CONFIGURED TO CONTROL SOLDER FLOW AND METHOD OF MANUFACTURING OF SAME

CROSS REFERENCE TO RELATED APPLICATIONS

This application claims priority under 35 U.S.C. §119(e) to U.S. Provisional Application Ser. No. 61/789,552 filed on Mar. 15, 2013, which is incorporated by reference herein in its entirety for all purposes.

FIELD OF THE INVENTION

This application relates to interconnect structures for receiving flip chip assemblies.

BACKGROUND OF THE INVENTION

Flip chip assembly is a method for interconnecting semiconductor devices, such as integrated circuit (IC) chips, and microelectromechanical systems (MEMS), to external circuitry, such as circuit boards or another chip. Typically, solder bumps are deposited on pads on the IC chips on the top side of the wafer during the final wafer processing step. The circuit board for interconnection has pads configured to align with the pads on the IC chip. In order to mount the IC chip to the external circuit, the IC chip is flipped over so that its top side faces down. The IC chip is then aligned so that its pads align with matching upward-facing pads on the external circuit. The solder of the bumps is then caused to flow and subsequently solidify to join the respective pads of the IC chip and the external circuitry. The IC chip that is designed to be flipped over in this manner is referred to as a flip chip.

A circuit board that is configured to receive a flip chip includes a dielectric substrate on which are defined contact pads for receiving the solder bumps disposed on the IC chip pads. A solder mask, in the form of a patterned layer of material that tends to resist the flow of solder, is defined over the contact pads and exposed substrate material. The solder mask layer is patterned to contain the solder generally to the contact pads. The solder mask thus prevents undesirable spread of the solder beyond the contact pad and the immediately adjacent portion of transmission lines in contact with the contact pad. However, in high frequency radio frequency (RF) applications, the solder mask degrades signal transmission in the circuit line in the area near the contact pad.

As pitch (the space between trace lines) becomes smaller due to the increased density of IC chips and the increased number of interconnections, the use of solder masks becomes problematic. Controlling the size of the holes in the solder mask and registration of the holes to the metal circuitry become more important. The size of the holes in the solder mask layer may need to be larger than desired to account for the tolerances on the solder mask hole size and registration. Larger solder pads and variation in pad size affect the height of the solder joints. The solder joint height sets the gap between the chip and the circuit board. For reliability, the gap between the chip and circuit board is typically filled with an encapsulant adhesive, called an underfill. A larger and more consistent gap between the chip and the circuit board is desirable to facilitate the underfill process. The thickness of the solder mask also reduces the gap between the chip and the circuit board. Eliminating the solder mask also increases the gap through which the underfill will flow.

Furthermore, in RF applications, particularly high-frequency RF applications, additional restrictions on the design of interconnect structures and IC chip interconnections may be needed to avoid RF transmission losses.

SUMMARY

An interconnect structure configured for solder flow control includes an insulating substrate and a conductive transmission line and a conductive contact pad in electrical contact with the transmission line defined on a surface of the substrate. The transmission line and contact pad may be defined in a layer of copper. A metal layer, which in embodiments is of nickel, is provided on the trace line and contact pad. A layer of gold is defined on the metal layer. The gold layer may be a thick gold layer, such as about 40 microinches, for use in RF applications. The thick gold layer is defined on the metal layer on the contact pad, and on the transmission line, except for a gap portion of the transmission line adjacent or near the contact pad. Thus, the metal layer is exposed in the gap layer, but is otherwise covered by the gold layer. An oxide layer is formed on the exposed segment of underlying metal. The oxide layer resists the flow of solder. When a flip chip is installed on the interconnect structure, the solder bump is aligned with the contact pad and the solder is reflowed. The solder adheres to the gold on the contact pad. The solder does not flow onto the oxide layer or onto the substrate. Thus, the oxide layer and the substrate completely surround the contact pad and contain the solder on the contact pad. The thick gold layer on the transmission line provides superior performance in transmission of RF signals.

DETAILED DESCRIPTION

In the prior art, an interconnect structure for interconnection with a flip chip is formed from a planar dielectric substrate having a conductive layer on its surface. The conductive layer may be a copper metallization layer, such as a copper foil. The substrates are often laminates, and thus the metalized boards are generally referred to as copper clad laminates. The copper layer is etched to define circuit lines, including trace lines and contact pads. A solder mask is applied to cover the substrate and circuit lines. Openings are defined in the solder mask in locations where it is intended to have the solder wet to. The flip chip is placed such that the solder bumps on the chip are aligned with the solder pads in the interconnect structure. The temperature of the solder is raised sufficiently to cause the solder to reflow and wet (e.g. adhere) to the areas defined by the openings in the solder mask.

Flip chips and associated interconnect structures are used, by way of example, for radiofrequency (RF) (about 3 kHz to about 300 GHz) applications. In those applications, the trace lines of the interconnect structure serve as transmission lines for RF signals. RF performance is limited by the size and conductivity of the transmission line. RF signals tend to propagate near the surface of the transmission line. Therefore, the size and conductivity of materials forming the portions of the transmission line at and near the surface of the transmission line have a more substantial impact on the RF properties of the transmission line than portions of the transmission line closer to the underlying substrate.

Figure 1:
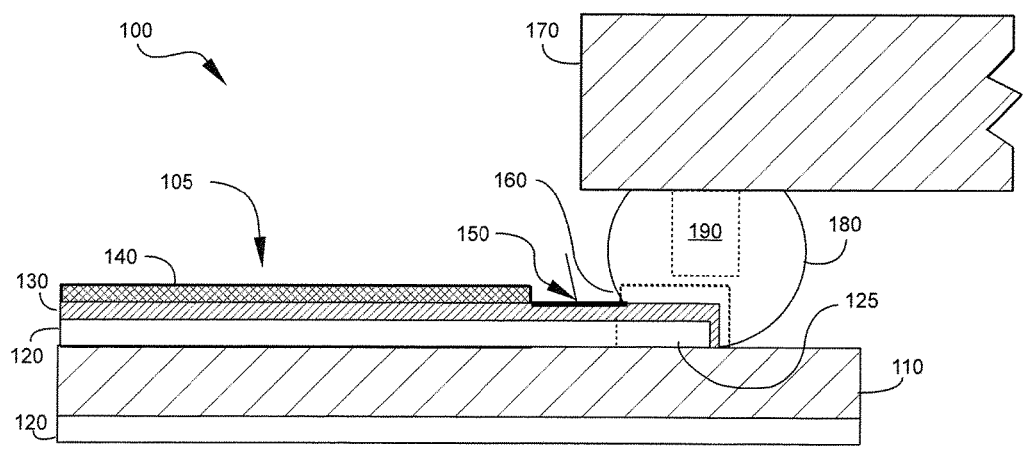
FIG. 1 is a sectional view of an interconnect structure and flip chip with solder bump according to an embodiment of the disclosure.

FIG. 1 is a sectional view of a flip chip interconnection 100 according to an embodiment of the present disclosure. A flip chip integrated circuit chip 170 includes a contact pad (not shown) on which a solder bump 180 is formed. During manufacture of flip chip 170, the solder bump 180 is formed on an upper surface of flip chip 170. In some embodiments, solder bump 180 was formed using a copper micropillar 190 with a solder cap. When flip chip 170 is installed onto interconnect structure 105, the chip 170 and solder bump 180 are flipped over, such that the solder bump 180 is on the bottom surface of the chip 170 relative to the interconnect structure 105.

The interconnect structure 105 includes a substrate 110. The substrate may be an organic material. The organic material may be a laminate made up generally of cloth or fiber and thermoset resin; exemplary laminates include those designated as FR-4, FR-1 and CEM-2. In other embodiments, the substrate may be of a ceramic.

A copper film 120 is defined on one or more surfaces of the substrate 110. The copper film 120 may be a foil which is applied to the surface of substrate 110. The board having copper film 120 is known as a copper clad board. In an embodiment, to form circuit lines on the substrate 110, the copper film 120 is etched to expose portions of substrate 110 and define conductors on the surface, including a trace line and a contact pad 125. A metal layer 130, which may be of nickel, is defined on the copper trace lines and contact pad 125. A gold layer 140 is defined on the metal layer 130. The gold layer is defined on contact pad 125 and the trace line, but not in gap 150. In the gap 150, the underlying metal layer 130 is exposed. The gold layer may be a thick gold layer, such as about 40 micro-inches in thickness. An oxide layer 145 is formed on the exposed portion of metal layer 130 at gap 150. Contact pad 160 receives the solder bump 180 of flip chip 170. The direct contact between the solder 180 and the gold plating layer 140 on contact pad 160 will cause the gold to dissolve into the solder joint. The oxide layer on the exposed portion of the metal layer 130 and the substrate 110 are both non-wettable, or, in other words, have poor solderability characteristics. The oxide layer 145 and the substrate 110 together surround the gold layer at contact pad 160 and define a solder barrier. When solder bump 180 is placed in contact with gold layer at contact pad 160 and heated sufficiently to reflow, the solder will not flow beyond the gold plated contact pad 160. The solder does adhere to the highly wettable surface defined by the gold outer layer of contact pad 160. The solder thus forms a strong physical bond with gold plated contact pad 160, and a good electrical connection between contact pad 160 and a contact pad on flip chip 170. The gold plating on contact pad 160 will typically be consumed and dissolved into the solder during the flip chip attachment. Accordingly, the gold plating on contact pad 160 is shown in dashed lines. The solder will bond to the metal (e.g. nickel) layer 130 which was under the gold plating layer 140 of contact pad 160. If solder bump 180 was formed using a copper micropillar 190 with a solder cap, not all of the gold plating on contact pad 160 is dissolved into the solder during attachment.

Thus, the oxide layer 145 in gap 150 defines a solder barrier region. The solder barrier region, together with the substrate 110, provide control of solder flow. The solder barrier region, defined by a patterned gold layer 140, has much greater precision than the solder mask of the prior art.

Exemplary dimensions of the gap 150 are about 25 microns to 100 microns. Exemplary dimensions of the contact pad 160 are about 50 microns to 200 microns. The contact pad may be circular, oblong, rectangular or any other shape. An exemplary width of the trace line is about 15 microns to 100 microns.

If gold layer 140 is a thick layer, of about 40 micro inches, the trace line made up of copper layer 120, nickel layer 130 and gold layer 140 exhibits good performance in radio frequency applications. RF current, particularly high frequency RF current, propagates through conductors near the skin, or surface, of the conductor. Thus, a transmission line having a copper film layer 120, a metal (e.g. nickel) layer 130 and a thick gold plating layer 140 provides good RF transmission properties for the length of the circuit line, as the overall performance approaches the excellent RF performance of gold. The absence of the thick gold layer in the gap 150 reduces performance. However, a gap width of the dimensions noted above results in only minor degradation of the quality of signals.

Gold layer 140 may extend from the solder barrier region 150 away from the contact pad 160 for an entire length of the trace line. For example, the trace line may run from the contact pad 160 to another component, an output terminal, a through via, or other interconnection. In embodiments, an entire length of the transmission line except for the gap 150 is plated with a thick gold layer to provide good RF transmission properties along the entire length of the transmission line.

According to an embodiment, metal layer 130 is of nickel and has a minimum thickness of about 40 microinches. The metal layer 130 should be sufficiently thick to serve as a barrier to prevent or minimize diffusion of gold from gold layer 140 into copper layer 120. Electroless nickel plating techniques may be employed to form a metal layer 130 of nickel, by way of example.

For RF applications, gold layer 140 may have a minimum thickness of around 30 microinches. Thus, plating techniques which form the proper thickness of gold, such as electroplating, may be used to selectively plate the metal layer 130 with thick gold layer 140. Other plating techniques which provide a thin coating of gold, such as flash, electroless immersion gold plating and electroless nickel/immersion gold (ENIG) plating may be employed. These plating techniques do not result in a transmission line having as good performance as lines having a thick gold layer for RF applications. However, these plating techniques may also be used for applications other than RF.

Some or all of the gold will diffuse into the solder at the contact pad 160 unless the solder bump 180 was formed using a copper micropillar 190 with a solder cap. This may have some deleterious effect on the structural integrity of the solder joint formed between contact pad 160 and the corresponding contact pad on chip 170.

Figure 2A:
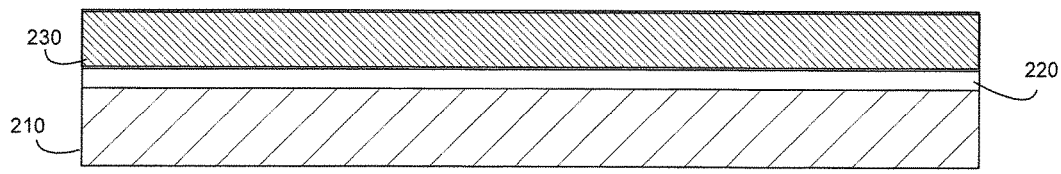
FIG. 2A through FIG. 2F are sectional views of a process of manufacturing an interconnect structure according to an embodiment of the present invention.
Figure 2B:
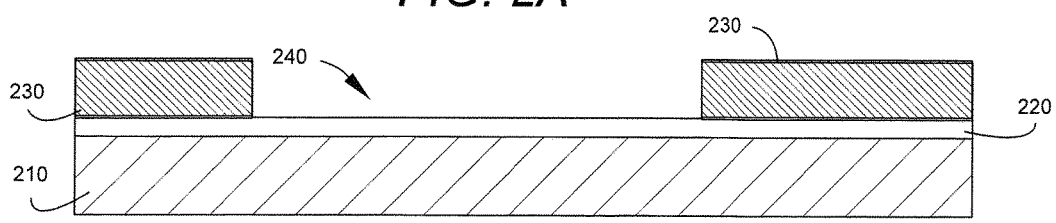

FIG. 2A-FIG. 2G show an exemplary process of making an interconnect structure according to an embodiment of the present disclosure. Referring to FIG. 2A, an organic substrate 210 has an upper surface on which a thin copper film 220 is disposed. A resist layer 230 is formed on the copper film 220. Resist layer 230 is developed to define a mask, as shown in FIG. 2B. The mask leaves exposed a portion 240 of the copper layer defining the features, such as transmission lines, pads, and other features, to be defined on the substrate.

Figure 2C:
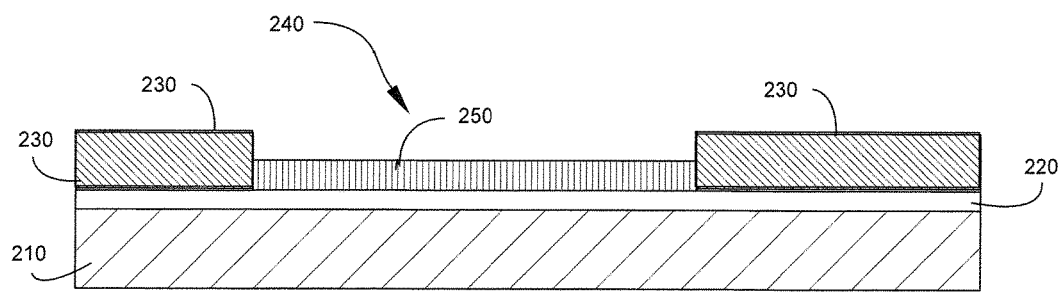

Referring to FIG. 2C, a nickel or other suitable metal layer 250 has been formed selectively on the exposed portions of copper layer 220. An exemplary technique for formation of nickel is the electroplated nickel/gold process. The electroplating Ni/Au process is well known to those of ordinary skill in the art. In general terms, during electroplating Ni/Au processing, electrical current reduces dissolved metal cations so that they form a coherent metal bond to a conductive surface. Nickel does not form on resist 230. The upper surface of resist 230 remains exposed. As an alternative to nickel, other metals may be employed. Any metal which will develop an oxide layer when exposed to atmospheric conditions, and which metal oxide exhibits poor solderability, or is non-wettable, may be employed in the place of nickel in embodiments.

Figure 2D:
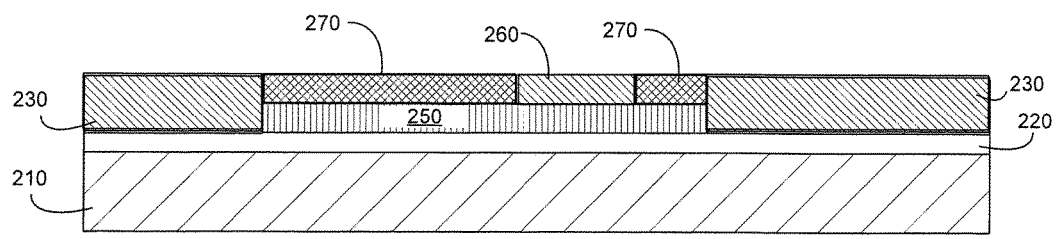

In FIG. 2D, a mask of resist 260 has been formed on a portion of nickel layer 250. Resist 260 defines the portion of nickel layer 250 which is to remain exposed after application of a gold layer. After application and patterning of resist 260, the remainder of nickel layer is exposed. A thick gold plating layer 270 is then selectively formed on exposed portions of the nickel layer 250. The gold layer may be formed by any suitable technique. By way of example, electroplating may be employed to form a sufficiently thick gold layer for use in RF applications. For other applications, other techniques for forming the gold layer, such as electroless gold plating, may be employed. However, the gold layer may not be sufficiently thick to provide desired performance for RF applications if techniques other than electroplating are used.

The structure is then etched in one or more steps. For example, a suitable etch chemistry that selectively removes the resist and exposed copper, but does not attack the gold and nickel layers, may be used in a single etch step. Alternatively, a first etch step may be employed using an etch chemistry that removes the resist layers 260, 230. A second etch step may be employed using an etch chemistry that selectively removes the exposed copper but not the gold and nickel layers. In this etch step, the gold and nickel layers serve as a mask. After etching, the portion of nickel layer 250 formerly covered by resist 260 is exposed to the atmosphere. After exposure to the atmosphere at room temperature and pressure for a suitable period, which may be a period of days or weeks, an oxide layer 275 forms on the exposed portion of nickel layer 250, forming the structure shown in FIG. 2E. According to an embodiment, the oxidation process may be accelerated by exposing the interconnect structure to a high temperature and/or oxygen-rich environment. As may be seen in FIG. 2E, substrate 210 supports copper trace 220 which defines the circuit lines, including transmission lines and pads, for example, of the interconnect structure. Nickel layer 250 covers the copper trace 220. A thick gold plating layer 270 covers portions of the nickel layer 250 defining a pad area 280 and a signal line portion 290. A gap 295 is defined between the contact pad area 280 and the signal line portion 290 of gold layer 270. In gap 295, oxide layer 275 is defined on nickel layer 250. As discussed above, oxide layer 275 has properties of poor solderability.

Figure 5:
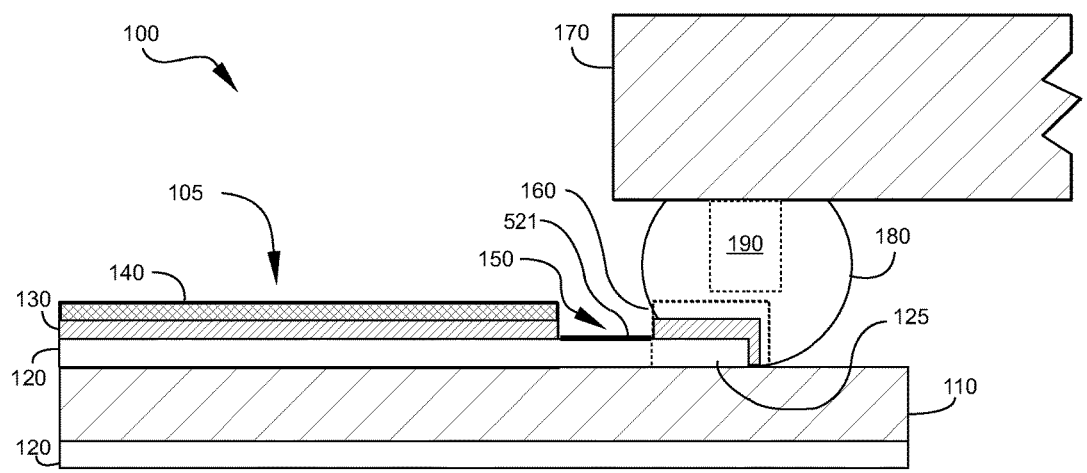
FIG. 5 is a sectional view of an interconnect structure and flip chip with solder bump according to an embodiment of the disclosure.

Referring to FIG. 5, which is similar to FIG. 1 and in which like elements are referenced by like numerals, an alternative embodiment is shown. In this embodiment, the patterned gold layer 140 and metal layer 130 define gap 150 exposing the lower copper layer 120. The exposed copper layer 120 may be oxidized to form an oxide layer 521 on the surface of the copper layer 120 at the gap. Oxidizing of the copper may be achieved by a black or brown oxide plating process, by way of example. The exposed area at gap 150 of the copper trace may be obtained by selectively plating both the metal layer 130 and the gold layer 140 similarly to the patterning of the gold layer 140 shown in FIG. 1. For example, a photoresist mask may be placed on the copper layer 120 at the regions defined by gap 150 while the metal layer 130 and gold layer 140 are formed over copper layer 120. The photoresist is removed to leave an exposed area of copper layer 120 at gap 150. An oxidizing process is then performed on the exposed surface of the copper layer 120 to form oxide layer 521 on the surface of the exposed copper layer 120. The oxidation process may be performed at a temperature that exceeds room temperature. For example, a black or brown oxide plating process may be conducted between about 20° C. and about 80° C. The oxide layer 521 may be plated to a thickness of about 200 nanometers (nm) to about 400 nm. According to an embodiment, the oxide layer 521 is about 300 nm.

Figure 2E:
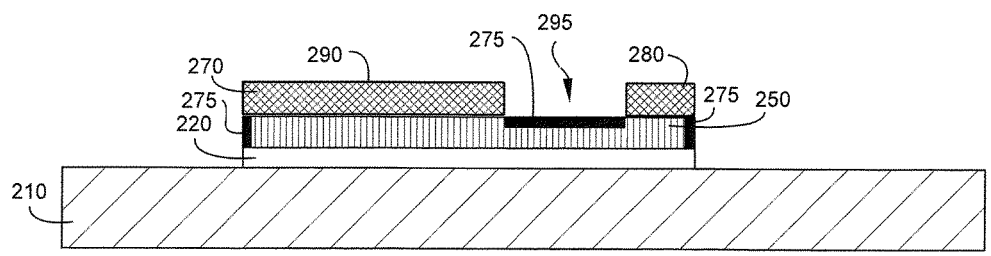
Figure 2F:
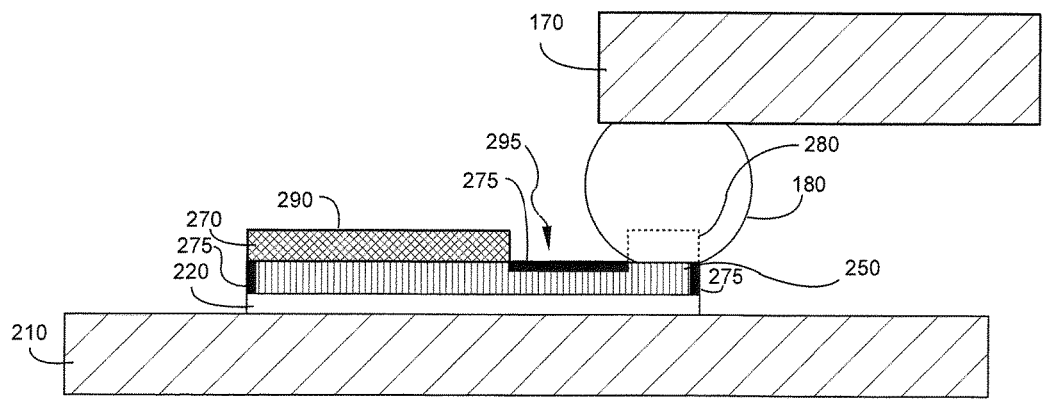

FIG. 2F shows the interconnect structure of FIG. 2E with a flip chip 170 connected to the contact pad area 280 via solder bump 180. The chip 170 is inverted and the suspended solder bump 180 is aligned with the gold plated pad 280. Solder bump may be of any suitable solder. Examples of suitable solders include suitable tin-based solders, such as a high lead content lead tin (PbSn) solder. Other suitable solders may include lead-free alloys such as tin silver copper (SnAgCu), eutectic gold tin (AuSn), or pure tin (Sn). The thick gold plating layer 270 on the contact pad area 280 provides a surface which is wettable, or has good solderability characteristics. During flip chip attachment, it can be expected that all of the gold plating on the contact pad area 280, depicted in FIG. 2F in dashed lines, will be consumed and dissolved into the solder joint unless the solder bump 180 was formed over a plated copper pillar with a solder cap. In such a case, there may not be enough solder to dissolve all of the gold and only a portion of the gold plating may be dissolved. The oxide layer 275 and the exposed substrate 210 both have poor solderability characteristics. Thus, oxide layer 275 and exposed substrate 210, surrounding contact pad 280, form a barrier or dam to flow of solder.

In some applications, the solder balls of the chip 170 are dipped in flux to enhance solderability at the contact pads. It should be noted that excessive amounts of flux may reduce the effectiveness of oxide layer 275. Excessive amounts of flux may cause solder to flow onto oxide layer 275. An aggressive flux may react with oxide layer 275, exposing the underlying nickel and resulting in flow of solder beyond contact pad 280. Those of ordinary skill in the art will be able to select suitable volumes and types of flux.

Figure 3A:
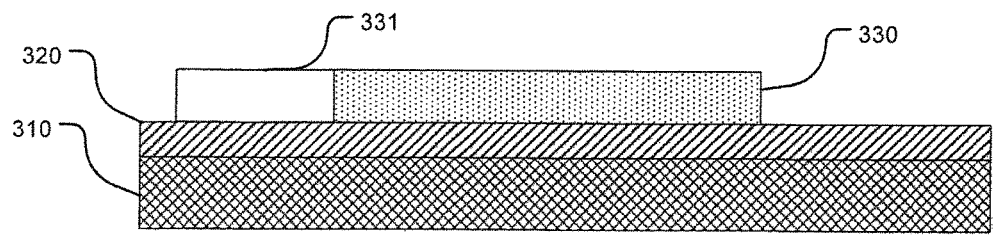
FIG. 3A through FIG. 3F are sectional views of a process of manufacturing an interconnect structure according to an embodiment of the present invention.
Figure 3B:
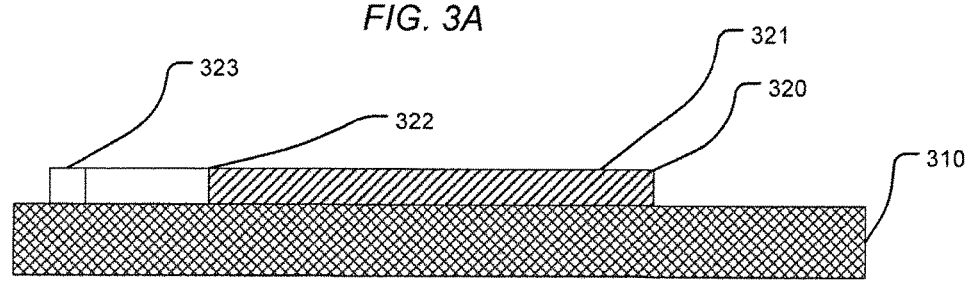

FIG. 3A-FIG. 3F are sectional views of an alternative exemplary process of manufacturing an interconnect structure according to an embodiment of the present disclosure. FIG. 3A shows a substrate 310. A thin copper film 320 is formed on the substrate 310 and a resist 330 is placed over the surface of the thin copper film 320. The resist 330 is patterned to form a mask, exposing the portions of the copper to be removed to provide the patterns of the desired traces on the substrate. In FIG. 3A, a portion of the pattern of the resist may be seen, as portion 331 is not in section, but is an exposed side wall of the resist. After etching the copper, the remaining resist may be removed to expose the copper traces on the interconnect structure as shown in FIG. 3B. In FIG. 3B, patterned copper 320 includes a contact pad base 321 (shown in section), a transmission line base 322 (shown partly in section) extending from contact pad base 321 to via 323.

Figure 3C:
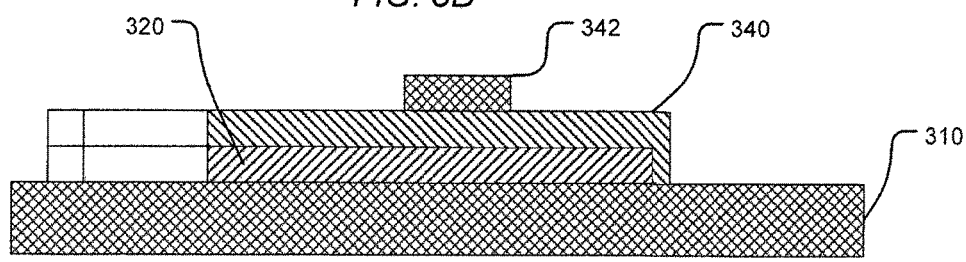

Referring now to FIG. 3C, a nickel layer 340 is selectively formed, such as by electroless nickel plating, on exposed areas of the patterned copper traces 320. An area of the nickel layer 340 over which a gold layer is not to be plated is defined and a mask 342 is defined on the surface of the nickel layer 340 covering the area not to be plated with gold.

Figure 3D:
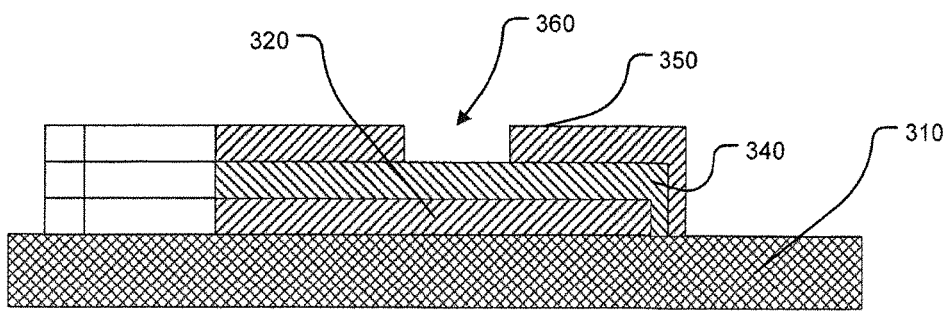

A thick layer of gold 350 is then plated selectively on the exposed portions of the nickel layer 340, and the mask is removed, to provide the structure shown in FIG. 3D. A gap is defined in gold layer 350, forming gap 360 in which a portion of the nickel layer 340 is exposed.

Figure 3E:
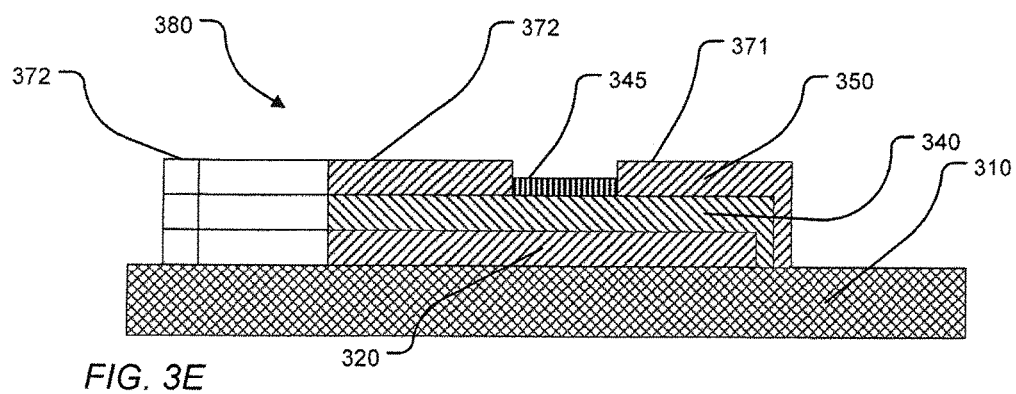

The board bearing the structure of FIG. 3D may be maintained at ordinary room conditions for a time period sufficient for formation of oxide layer 345, shown in FIG. 3E. For example, a period of at least three to five days may be a sufficient time period. In embodiments, oxidation may be accelerated by suitable techniques, such as maintaining the board at elevated temperatures in a conventional or oxygen-enriched atmosphere. FIG. 3E shows a completed structure 380, including contact pad 371 having copper, nickel and gold layers, transmission line 372 having copper, nickel and gold layers, with the exception of the gap portion adjacent contact pad 371 on which oxide layer 345 is formed, which has no top gold layer. Via 373 to which transmission line 372 connects is also shown. Structure 380 may be described as an interconnect structure for connecting a carrier to a flip chip.

Figure 3F:
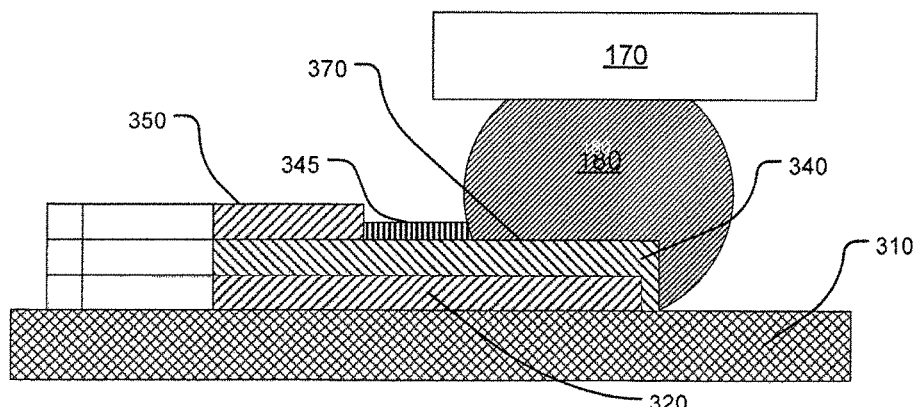

In FIG. 3F, a flip chip 170 is shown interconnected to contact pad 371 by solder 180. When flip chip 170 was aligned, with solder bump 180 aligned with contact pad 371, solder bump 180 was heated sufficiently to reflow. The nickel oxide layer 345 resists adherence and flow of the solder due to the oxide's non-wetting characteristics. Similarly, the substrate 310 surrounding the other edges of the contact pad 371 resists adherence and flow of the solder. The nickel oxide layer 345 and the surface of substrate 310 serve as a barrier or dam to prevent solder flow. The solder in solder bump 180 adheres to the thick gold plating at the solder pad to form the electrical interconnect between the chip 170 and the interconnect structure. During flip chip 170 attachment, the gold outer layer of the contact pad 371 may be consumed and dissolved into the solder joint, leaving the solder bonded to the nickel layer 340, as shown in FIG. 3F.

In addition to forming a solderable surface for solder bump 180, the thick gold plating layer 350 provides good RF properties for the circuit line and improves the RF characteristics of the transmission line, especially in high-frequency RF applications.

Figure 4:
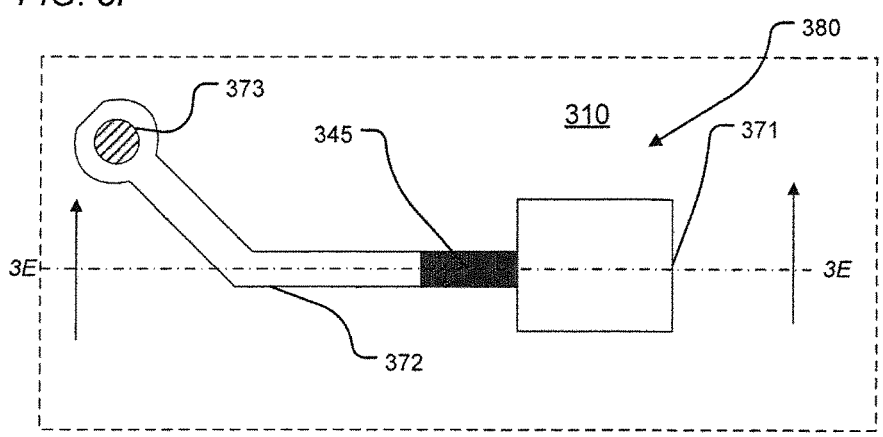
FIG. 4 is a plan view of the interconnect structure of FIG. 3E according to an embodiment of the present invention.

Referring to FIG. 4, a top plan view of structure 380 of FIG. 3E is shown. FIG. 3E is a section view along line 3E-3E of FIG. 4. Contact pad 371 is in contact and electrical communication with transmission line 372. Transmission line 372 extends to via 373. Nickel oxide layer 345 is shown on the portion of transmission line 372 adjacent to contact pad 371. Contact pad 371 and transmission line 372, other than nickel oxide layer 345, have a top gold layer. Conductive via 373 is merely exemplary of possible terminations of transmission line 372, which may include connections to a terminal of a component such as an RF antenna element. When a solder bump of a flip chip (e.g., solder bump 180 of flip chip 170 of FIG. 3F) is applied to contact pad 371 and heated to reflow, the solder is prevented from reflowing beyond contact pad 371 by the poor wetting properties of the oxide layer 345 and the substrate material 310. Thus, as may be seen in FIG. 4, oxide layer 345 and substrate material 310 define a solder flow barrier surrounding contact pad 371.

Oxide layer 345 is immediately adjacent to contact pad 371. In embodiments, oxide layer 345 may be separated from contact pad 371 by a length of transmission line 372 which is plated with gold. Oxide layer 345 still serves as a solder flow barrier, although solder may flow onto transmission line 372 in this embodiment.

The embodiments described in FIGS. 2A-2F and FIGS. 3A-3F are described in the context of a subtractive substrate process. One of skill in the art will recognize that the present disclosure is not limited thereto. Other processes for achieving the desired structure may be used. By way of non-limiting example, an equivalent structure may be achieved through semi-additive processes (SAP). In SAP, a thin seed layer of trace metal (e.g. copper) is deposited on the surface of a substrate. The circuit traces are built up through photoresist masks and plating. After selectively plating, the photoresist and the unplated portions of the seed layer are removed by a process such as etching.

While the above structures have been described in light of an organic substrate having copper traces plated with layers of nickel and gold, it will be understood by a skilled artisan, that other substrates and metals could be used. For example, the substrate could be a ceramic substrate. Ceramic substrates are known for use in RF circuit applications. When using a substrate such as a ceramic, different plating metal may be used in place of the nickel layer to produce the segment of oxide which prevents solder from reflowing past the solder pad. By way of non-limiting example, when using a ceramic substrate, a refractory metal may be used as an adhesion layer between the ceramic substrate and the circuit lines which are typically formed from gold. Refractory metals such as tungsten or chromium, as well as other refractory metals, may be used in such alternative embodiments. The substrate top surface must have poor wetting characteristics so as to serve as a barrier to solder flow. In those embodiments, a refractory metal layer is on a ceramic substrate and underlies a patterned gold layer that forms an RF transmission line leading to a contact pad. A gap in the gold layer is defined on the RF transmission line adjacent the contact pad, leaving the refractory metal layer exposed in the gap. An oxide forms on the exposed portion of the refractory layer. The oxide of the refractory metal serves as a barrier to solder flow. The upper conductive layer may be a conductor other than gold in embodiments.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. An interconnect structure configured to control solder flow, comprising:
   a dielectric substrate;
   a copper trace defined on a surface of said substrate, the copper trace defining at least a contact pad and a transmission line in contact with the contact pad;
   a metal layer covering said copper trace; and
   a gold layer covering the metal layer on the contact pad and transmission line, the gold layer defining a gap over a portion of the transmission line adjacent or near the contact pad, the metal layer exposed in the gap, an oxide being on the exposed metal layer.

2. The interconnect structure of claim 1, said gold layer having a thickness sufficient to cause a radio frequency (RF) signal transmitted on said transmission line to propagate substantially within said gold layer.

3. The interconnect structure of claim 2, wherein said gold layer has a thickness of about 30 microinches to about 40 microinches.

4. The interconnect structure of claim 1, wherein said metal layer comprises nickel.

5. The interconnect structure of claim 1, wherein said metal layer has a minimum thickness of about 40 microinches.

6. The interconnect structure of claim 1, said metal layer having a thickness sufficient to minimize diffusion from said gold layer into said copper trace.

7. The interconnect structure of claim 1, wherein said gold layer covers said copper trace along an entire length of said transmission line, except at a location defined by said gap.

8. The interconnect structure of claim 1, wherein said gap has a dimension along the longitudinal extent of said transmission line of about 25 microns to about 100 microns.

9. The interconnect structure of claim 1, wherein said contact pad has a dimension about its length of about 50 microns to about 200 microns.

10. A method of manufacturing an interconnect structure controlling solder flow, said method comprising the steps of:
    forming, on a copper clad board substrate, a metal layer defining a circuit trace including at least a contact pad and a transmission line in contact with the contact pad;
    forming a gold layer over portions of said metal layer to define a gap exposing the metal layer at a portion of the transmission line adjacent to or near the contact pad; and
    forming an oxide layer on a surface of the metal layer at a location of the gap.

11. The method of claim 10, wherein the forming an oxide layer on the metal layer comprises subjecting the exposed metal layer portions to an environment having a temperature elevated above room temperature.

12. The method of claim 10, further comprising:
    etching said interconnect structure to remove copper cladding on the substrate at areas not covered by the metal layer to define at least one circuit trace.

13. The method of claim 10, wherein the metal layer is formed to a thickness of about 40 microinches.

14. The method of claim 10, wherein the gold layer is formed to a thickness of about 30 microinches to about 40 microinches.

15. The method of claim 10, wherein the gap is defined to have a dimension along the longitudinal extent of the transmission line of about 25 microns to about 100 microns.

16. The method of claim 10, wherein the metal layer comprises nickel.

17. The method of claim 10, wherein the metal layer is formed using a nickel/gold electroplating process.

18. The method of claim 10, wherein said gold layer is formed using a gold electro-plating technique to a thickness of at least about 30 microinches.

19. An integrated circuit flip chip assembly for controlling solder flow comprising:
    an integrated circuit chip having a first surface, said first surface having at least one first contact pad, each of said at least one first contact pad having a solder ball defined thereon; and
    an interconnect structure for receiving said integrated circuit chip, said interconnect structure comprising:
    a dielectric substrate;
    at least one copper trace defined on a surface of said substrate, said copper trace defining a transmission line and a second contact pad configured to bond via said solder ball to said at least one first contact pad;
    a metal layer selectively disposed on said at least one copper trace, said metal layer covering said transmission line and said second contact pad;
    a gold layer selectively disposed on said metal layer at locations of the second contact pad and a portion of said transmission line, said gold layer defining a gap adjacent to or near said second contact pad, a surface of said metal layer being exposed in the gap; and
    an oxide layer on the exposed surface of said metal layer at said gap.

20. The integrated circuit flip chip assembly of claim 19, wherein said metal layer comprises nickel.

* * * * *